United States Patent
Zhang et al.

[11] Patent Number: 6,156,395
[45] Date of Patent: Dec. 5, 2000

[54] PLASMA ENHANCED CHEMICAL VAPOR DEPOSITION (PECVD) METHOD OF FORMING VANADIUM OXIDE FILMS AND VANADIUM OXIDE THIN-FILMS PREPARED THEREBY

[75] Inventors: Ji-Guang Zhang; C. Edwin Tracy; David K. Benson, all of Golden; John A. Turner, Littleton; Ping Liu, Lakewood, all of Colo.

[73] Assignee: Midwest Research Institute, Kansas City, Mo.

[21] Appl. No.: 09/325,146

[22] Filed: Jun. 3, 1999

Related U.S. Application Data

[63] Continuation of application No. 08/948,832, Oct. 10, 1997, abandoned.

[51] Int. Cl.$^7$ .................................................. C23C 16/40
[52] U.S. Cl. .................. 427/576; 427/126.3; 427/255.29
[58] Field of Search ................................ 427/576, 126.3, 427/255.29

[56] References Cited

U.S. PATENT DOCUMENTS 4,687,560   8/1987   Tracey et al. .

FOREIGN PATENT DOCUMENTS 58-161767   9/1983   Japan .

OTHER PUBLICATIONS

Deutschmann et al., Advanced Materials, vol. 6, No. 5, pp. 392–395, 1994 (no month).

*Primary Examiner*—Timothy Meeks
*Attorney, Agent, or Firm*—Ken Richardson; Paul J. White

[57] ABSTRACT

A method is disclosed of forming a vanadium oxide film on a substrate utilizing plasma enhanced chemical vapor deposition. The method includes positioning a substrate within a plasma reaction chamber and then forming a precursor gas comprised of a vanadium-containing chloride gas in an inert carrier gas. This precursor gas is then mixed with selected amounts of hydrogen and oxygen and directed into the reaction chamber. The amounts of precursor gas, oxygen and hydrogen are selected to optimize the final properties of the vanadium oxide film An rf plasma is generated within the reaction chamber to chemically react the precursor gas with the hydrogen and the oxygen to cause deposition of a vanadium oxide film on the substrate while the chamber deposition pressure is maintained at about one torr or less. Finally, the byproduct gases are removed from the plasma reaction chamber.

15 Claims, 8 Drawing Sheets

PLASMA ENHANCED CHEMICAL VAPOR DEPOSITION (PECVD) METHOD OF FORMING VANADIUM OXIDE FILMS AND VANADIUM OXIDE THIN-FILMS PREPARED THEREBY

CROSS-REFERENCE TO OTHER APPLICATIONS

This application is a Continuation of U.S. patent application Ser. No. 08/948,832, filed Oct. 10, 1997, now abandoned, and entitled "Plasma Enhanced Chemical Vapor Deposition (PECVD) Method of Forming Vanadium Oxide Films and Vanadium Oxide Thin-Films Prepared Thereby.

CONTRACT ORIGIN OF THE INVENTION

The United States Government has rights in this invention pursuant to Contract No. DE-AC-36-83CH 10093 between the United States Department of Energy and the National Renewable Energy Laboratory, a division of the Midwest Research Institute.

BACKGROUND OF THE INVENTION

1. Field of the Invention

The present invention relates generally to the deposition of ion-insertion layers on a substrate and, more particularly, to a chemical vapor deposition of thin-film materials useful in lithium rechargeable batteries. Specifically, the present invention relates to a plasma enhanced chemical vapor deposition (PECVD) method in the production of vanadium oxide thin-film layers.

2. Description of the Prior Art

In recent years, rapid miniaturization of electronic devices has greatly out-paced advances in battery technology. To reduce the size and cost of batteries, electronics manufacturers are increasingly interested in thin-film rechargeable batteries. These batteries have a unique advantage in that they can be incorporated into the same integrated circuit with other electronic elements. Since the thin layer material exhibits a lower electrical resistance, it then becomes practical to use some materials that cannot normally be used in bulk batteries because of their relatively high resistivity. Thin-film techniques also allow the exploration of the preparation of new materials. Such thin-film batteries can be used in a wide variety of applications such as gas sensors, micro-coulomb-meters, timers, micro-field-cells, capacitors, and electrochromic displays. The combination of high energy density, high specific energy and long cycle life makes thin-film rechargeable batteries a power source of choice for portable electronic devices into the next century. A more distant future application for thin-film batteries may also include electrical vehicles.

Of particular interest in this area are thin-film lithium rechargeable batteries. High capacity and stable cathodes are critical for the development of such lithium batteries. Moreover, these thin-film electrodes need to have a larger charging capacity and better cyclic stability than those of bulk electrodes. In the case of thin-film cathodes, the morphology of the film is very important to the cathode's charge capacity and cyclic stability. Appropriate preparation methods can provide a better film morphology and impart unique physical and chemical properties to the end products. Deposition temperature is one of several important factors that affects the structure and morphology of thin-films. It has been reported previously that a much better cyclic behavior was obtained for cells using cathodes prepared at lower temperatures. Many materials, such as $V_6O_{13}$, $V_2O_5$, $LiMn_2O_4$, $LiCoO_2$, $LiNiO_2$, and the like, have been investigated extensively as cathode materials for lithium-ion battery applications over the previous two decades or so. Among these materials, vanadium oxide-based cathodes have certain advantages because they have a larger charging capacity than other such cathode materials.

Known chemical vapor deposition (CVD) processes have been utilized to form thin-films, and these processes generally include the following sequence of steps. First, reactant gases of specific composition and flow rate as well as carrier inert gases are released into a reaction chamber. Then, the gas species reactants are adsorbed onto a substrate. The loosely bonded atoms then migrate across the substrate and cause film forming chemical reactions. Finally, the gaseous byproducts of the reaction are desorbed and removed from the reaction chamber. The chemical reactions that lead to formation of the solid material and substrate will either be heterogeneous, that is the reaction occurs only on the surface of the substrate, or homogeneous wherein the reaction occurs in the gas phase. Heterogeneous reactions are most desirable as the reaction occurs on a heated surface and therefore can be controlled to produce good quality films. Homogeneous reactions, on the other hand, are less desirable as they form gas phase clusters of material which results in poor adhesion and low density films, as well as create particulates in the reaction chamber.

There are two basic CVD reactor types which are used to deposit films. One type is the hot wall reactor utilizing low pressures (typically one torr or less) at high temperatures (generally 600° C. or greater). The other is the cold wall reactor which utilizes atmospheric pressure and a low temperature (less than 600° C.). The main advantages of a cold wall reactor are its simple construction, a fast deposition rate and a low deposition temperature. The main disadvantages include poor step coverage and gas phase homogeneous nucleation. Additionally, the cold wall reactor may be of the plasma-enhanced (PECVD) type wherein the chemical reaction is further promoted by activating the gas-phase reactants with an rf voltage field, thereby creating free electrons and a plasma in the reaction chamber.

The hot wall type of reactor generally provides the deposited films with excellent purity and uniformity while maintaining conformal step coverage. However, to produce this quality of film, the hot wall reactor normally requires a high deposition temperature while the deposition rate is low. In the past, the advantages of the low pressure hot wall reactor has out weighed its disadvantages thus allowing the hot wall reactor to become the most widely used method of depositing films to date.

The PECVD method has been utilized to prepare electro-optically active transition metal oxides such as disclosed in U.S. Pat. No. 4,687,560. Moreover, this PECVD process has also been used to prepare various materials such as tantalum oxide as illustrated in U.S. Pat. No. 5,256,455, barium titanate as disclosed in U.S. Pat. No. 5,006,363, titanium as disclosed in U.S. Pat. No. 5,173,327, nitride coating of magnetic recording heads as disclosed in U.S. Pat. No. 5,466,495, tungsten as shown in U.S. Pat. No. 4,969,415, and yttrium and zirconium as shown in U.S. Pat. No. 5,260,105. On the other hand, $VO_2$ films, which are especially useful for thermochromic applications, have previously been prepared by chemical vapor deposition at high temperatures without the introduction of a plasma. Since this prior art technique was based on CVD without plasma assistance, relatively high temperatures, i.e. approximately 300–700° C., have been required to effectively produce vanadium oxide thin films.

Consequently, there remains a need for high quality vanadium oxide films for use as cathodes in lithium rechargeable batteries wherein the vanadium oxide films are produced by a lower temperature process having high deposition rates, and wherein the films have high energy density and high discharge capacity.

SUMMARY OF THE INVENTION

It is, therefore, one object of the present invention to provide a chemical vapor deposition process for the production of vanadium oxide thin-films utilizing plasma enhancement.

It is another object of the present invention to provide a vanadium oxide thin-film layer having high charge capacity and cyclic stability.

Still another object of the present invention is to provide an economical process for producing vanadium oxide thin-films for specific use in lithium rechargeable batteries.

Yet another object of the present invention is to provide a process for the production by chemical vapor deposition of vanadium oxide thin-films wherein the deposition rate of these films is substantially higher than previous techniques yet it produces films having high charge/discharge capacity, high stability, and high energy density.

To achieve the foregoing and other objects in accordance with the purpose of the present invention, as embodied and broadly described herein, a method is disclosed of forming a vanadium oxide film on a substrate utilizing plasma enhanced chemical vapor deposition. The method includes positioning a substrate within a plasma reaction chamber and then forming a precursor gas comprised of a vanadium-containing gas in an inert carrier gas. This precursor gas is then mixed with selected amounts of hydrogen and oxygen and flowed through the reaction chamber. The amounts of precursor gas, oxygen and hydrogen are selected to optimize the final properties of the vanadium oxide film. An rf plasma is generated within the reaction chamber by applying rf power between the two electrodes inside of the chamber to initiate and accelerate reaction of the precursor gas with the hydrogen and the oxygen to cause deposition of a vanadium oxide film on the substrate while the chamber deposition pressure is maintained at about one torr or less. Finally, the byproduct gases are continuously removed from the plasma reaction chamber during the deposition process.

BRIEF DESCRIPTION OF THE DRAWINGS

The accompanying drawings which are incorporated in and form a part of the specification illustrate preferred embodiments of the present invention and, together with a description, serve to explain the principles of the invention. In the drawings.

DETAILED DESCRIPTION OF THE PREFERRED EMBODIMENT

Figure 1:
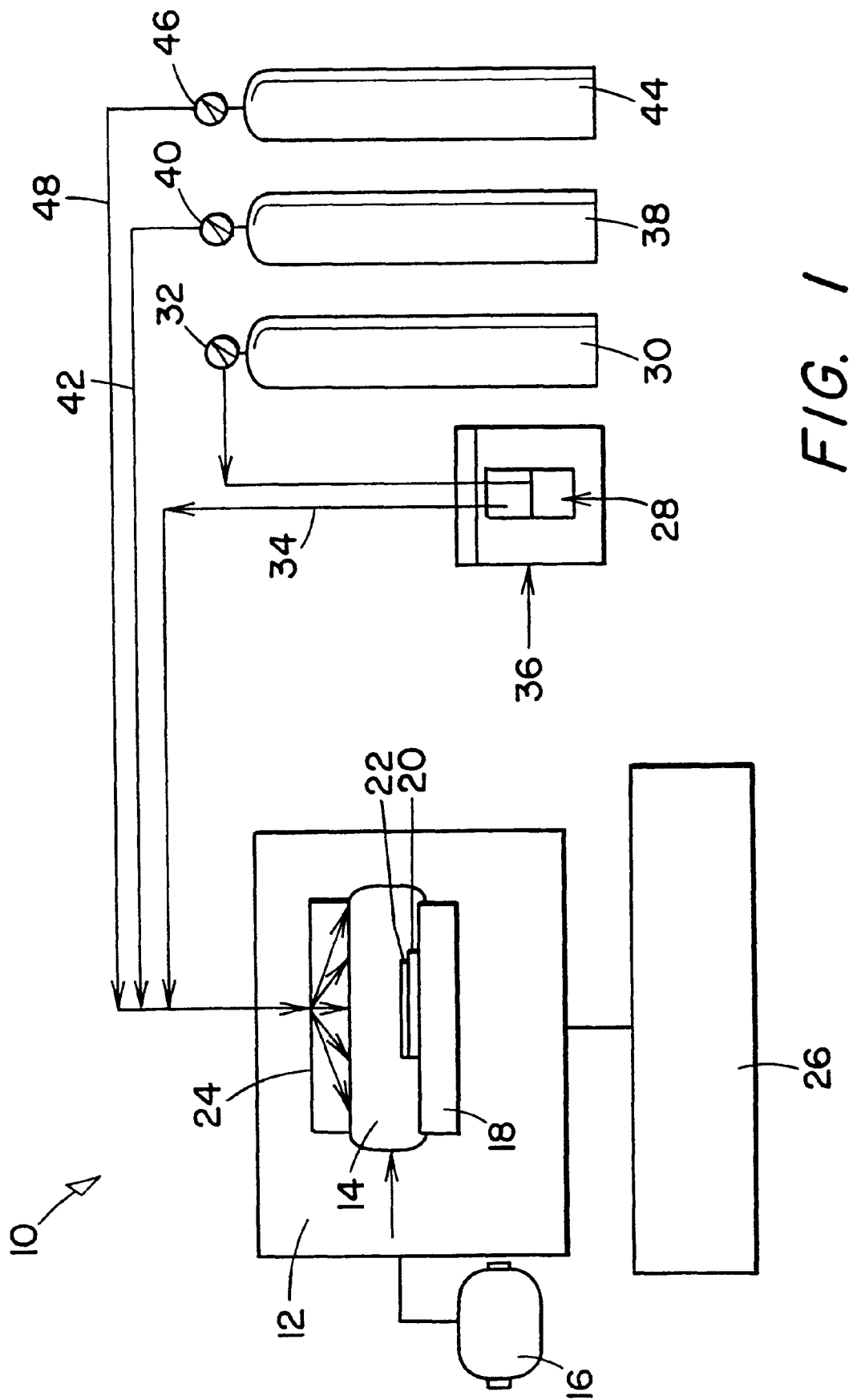
FIG. 1 is a schematic of a PECVD deposition system for carrying out the method of the present invention to form vanadium oxide thin-films.

Referring first to FIG. 1, a plasma enhanced chemical vapor deposition (PECVD) system 10 is disclosed for implementing the method of the present invention. Plasma enhanced CVD systems are well known to the art, as previously discussed, and therefore any deviations from the system described below are intended to be included within the scope of the invention as defined by the claims set forth below. In accordance with the present invention, a PECVD reaction chamber 12 is provided for containing an rf plasma 14 therein. The chamber 12 can be evacuated by a pump 16 thereby providing the desired vacuum within the chamber 12. The chamber 12 also houses a lower plate 18 which is grounded and supports a substrate 20 which may be any substrate known to the art but is preferably a glass substrate with an electrically conductive coating. The substrate 20 is provided for depositing a vanadium oxide film 22 in the manner described below. A plasma electrode or upper plate 24 assists in the production of the plasma 14. The plasma is generated and confined between the two plates 18 and 24 in the chamber 12. The upper plate 24 preferably has a dimension of about 240 mm in diameter, while the lower plate 18 preferably has a diameter of about 240 mm. The preferred distance between the plates 18 and 24 is about 32 mm. This creates a plasma volume of about 1,400 to 1,500 cc, or specifically 1,447 cc, A control panel 26 is provided for controlling the various parameters of the plasma deposition process such as reactant gas flow rates, dynamic reactant chamber pressure, and rf power input to the plasma.

A reactive precursor 28 is generally in the form of vanadium containing compounds which include, but are not limited to, $VX_3$, $VX_4$, $VOX_3$, where X=Cl, F Br or I. In addition, the vanadium containing compounds may also include vanadium hexacarbonyl ($V(CO)_6$), vanadyl alkoxides having the formula $VO(OC_nH_{2n+1})_3$ where n=1, 2, 3, 4. . . , vanadium 2,4-pentanedionates, vanadium acetylacetonates, cyclopentadienyl vanadium tetracarbonyl ($C_5H_5V(CO_4)_4$) and vandocene ($C_5H_5V$). Specifically, the most preferred precursor 28 is $VOCl_3$. The preferred vanadium oxytrichloride 28 is combined with an inert gas from a source 30 and is controlled by flow regulator valve 32 to form a precursor gas 34, which is the mixture of $VOCl_3$ and the inert carrier gas. The inert carrier gas 30 is preferably Argon, although any known inert carrier gas may be used. The temperature of the preferred precursor vanadium oxytrichloride 28 is controlled by a temperature controller 36.

The temperature of the precursor gas 34 is maintained generally between about −23° C. and 127° C. at a pressure of 1 torr to 760 torr. Preferably, the temperature is maintained at approximately 10° C. The vapor pressure of the reactive precursor 28 is preferably controlled at approximately 8 torr or 0.15 psi, while the pressure of the carrier gas 30 is adjusted to approximately 800 torr or 15 psi so that the partial pressure of the preferred vanadium oxytrichloride precursor 28 is approximately 1% of the precursor gas 34. However, the volume ratio of vanadium containing gas to inert gas in the precursor gas mixture can range from about 0.1%–100%. The precursor gas 34 having 1% reactant vapor ($VOCl_3$) is then combined with oxygen gas 42 from a gas source 38' which is controlled by a flow regulator valve 40, and hydrogen gas 48' which is provided by a hydrogen gas source 44 controlled by flow regulator valve 46. The flow rates of the precursor gas 34 containing 1% reactant vapor ($VOCl_3$) the oxygen and hydrogen were varied to control and optimize the properties of the film 22 as discussed below. Based on these findings, the preferred gas flow ratio of $VOCl_3$: $H_2$: $O_2$ is 1:Y:Z where Y ranges approximately from 1 to 50 while Z ranges approximately from 0 to 50.

Vanadium oxide has been found to be one of the most promising among the various candidates for cathode materials for secondary lithium batteries. It has been found that the maximum deposition rate of metal oxide materials obtained by PECVD methods can be about 10 times the rate possible with physical vapor deposition methods, such as sputtering, which methods were previously used as discussed above to form vanadium oxide films. The plasma 14 chemically excites the gases in the chamber 12 and imparts a chemical activity equivalent to a temperature which can be an order of magnitude higher than the actual temperature of the substrate 20. Therefore, the films 22 deposited at room temperature on the substrate 20 by PECVD techniques can have qualities as good as those prepared at high temperature using other methods. By controlling the ratio of the precursor gas, $O_2$ and $H_2$ reactant species 34, 42 and 48, respectively, optimized film compositions utilizing maximum deposition rates can be formed. The vanadium oxide thin films produced by the method of the present invention have a formula $V_xO_y$ where X and Y can be adjusted for desired results, preferably X=1–6 and Y=0–13, including the instance where Y=0 and the film is vanadium metal. Preferably, the thin-film layer is $VO_2$, $V_2O_5$, $V_6O_{13}$ or mixtures thereof, while the most preferred is $V_6O_{13}$.

A series of experiments was performed varying the partial pressures of the reactant gas 34, the oxygen 42 and the hydrogen 48. The weights of the substrates 20 with the deposited films 22 were measured before and after deposition in order to determine the net weight of the vanadium oxide films 22. Moreover, the thickness of the films 22 produced by the method of the present invention were measured with a DekTak profilometer after deposition. These films 22 were stored and tested inside a controlled-environment glove box under Argon atmosphere. The water and oxygen concentrations in the dry-box were measured to be less than 1 ppm and 1.5 ppm, respectively. The samples were then tested in an electrochemical cell having a three electrode configuration. Lithium metal was used as both counter and reference electrodes. A solution of 1M of $LiClO_4$ in propylene carbonate was used as the liquid electrolyte. The samples of the films 22 were tested at discharge/charge rates between C/0.1 to C/1.0 and cycled between 4.0 volts and either 1.8 volts or 1.5 volts at 25° C. The electrochemical experiments were performed using a computer controlled battery testing system.

EXAMPLE I

In the first set of experiments, the flow rates of the precursor gas 34 containing vanadium oxytrichloride, the preferred precursor, and the oxygen 42 were fixed at 500 and 3.8 standard cubic centimeters per minute (sccm), respectively, and a hydrogen 48 flow rate was then varied between 14 and 42 sccm All of the films 22 were deposited for 10 minutes, and the rf power to the system was controlled at 50 Watts while the chamber 12 pressure during deposition was maintained at approximately 0.6 torr. The typical reactions during the deposition of the films 22 can be expressed as the following:

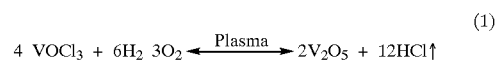

(1)

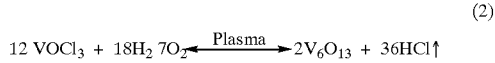

(2)

Figure 2:
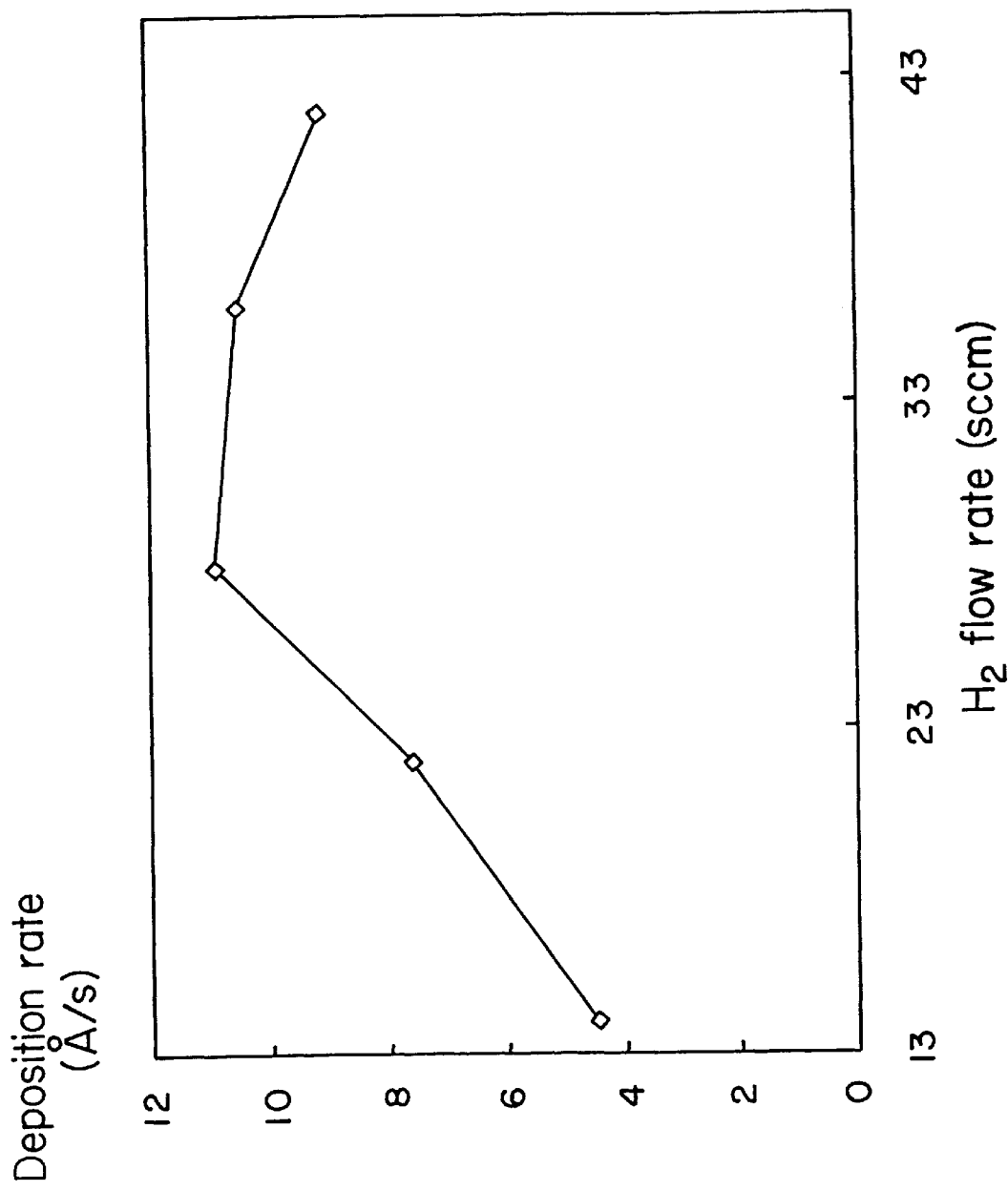
FIG. 2 is a graph illustrating vanadium oxide deposition rate as a function of hydrogen flow rate in the method of the present invention.

The addition of hydrogen helped to remove chlorine from the precursor 28 and accelerated the forward reaction. However, too much hydrogen can have an adverse effect, which can be attributed to dilution of the vanadium oxytrichloride reactant by high hydrogen flow. FIG. 2 illustrates the film deposition rate achieved as a function of the hydrogen flow rate. As can be seen from FIG. 2, the film deposition rate exhibits a maximum 11 Å/s at a hydrogen flow rate of about 28 sccm at the given conditions. Typical literature values for the deposition rate of vanadium oxide films using prior art thermal evaporation techniques is on the order of 2 Å/s. Therefore, the method of the present invention provided a deposition rate of more than five times the prior art value.

Another property of vanadium oxide films which is important is their density. For the films deposited in this EXAMPLE I at a hydrogen flow rate of 28 sccm, the density of the film was about 3.1 g/cm³. It has been found that bulk $V_2O_5$ and $V_6O_{13}$ have a reported density of 3.36 and 3.90 g/cm³, respectively. Considering that the density of thin-film material is usually 10–20% less than that of bulk material, the vanadium oxide films 22 formed in this particular EXAMPLE I utilizing the method of the present invention yielded a density close to that of $V_6O_{13}$.

EXAMPLE II

Figure 3:
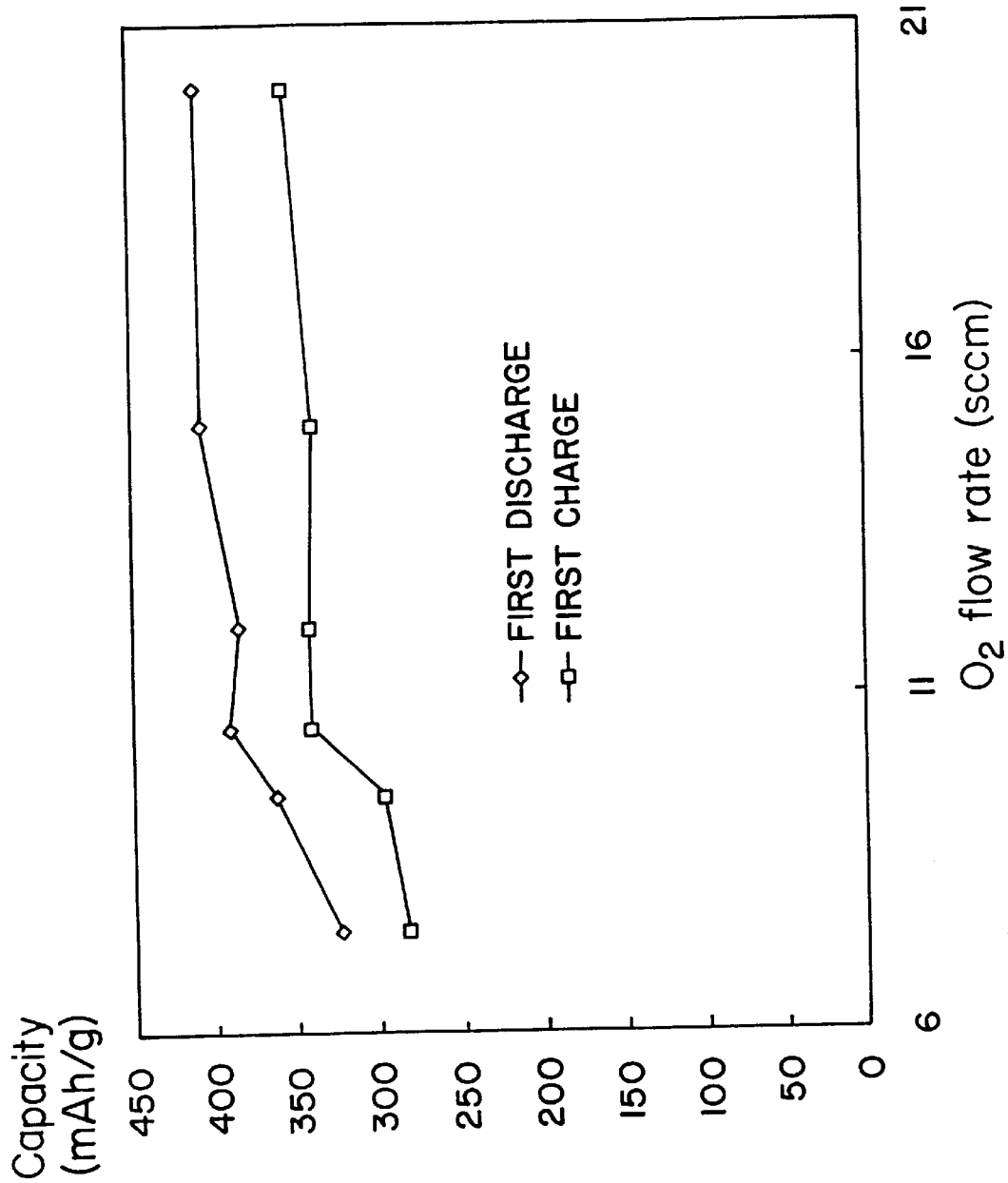
FIG. 3 is a graph illustrating charge and discharge capacity of the subject vanadium oxide thin-film as a function of $O_2$ flow rate during thin-film deposition of the method of the present invention.
Figure 4:
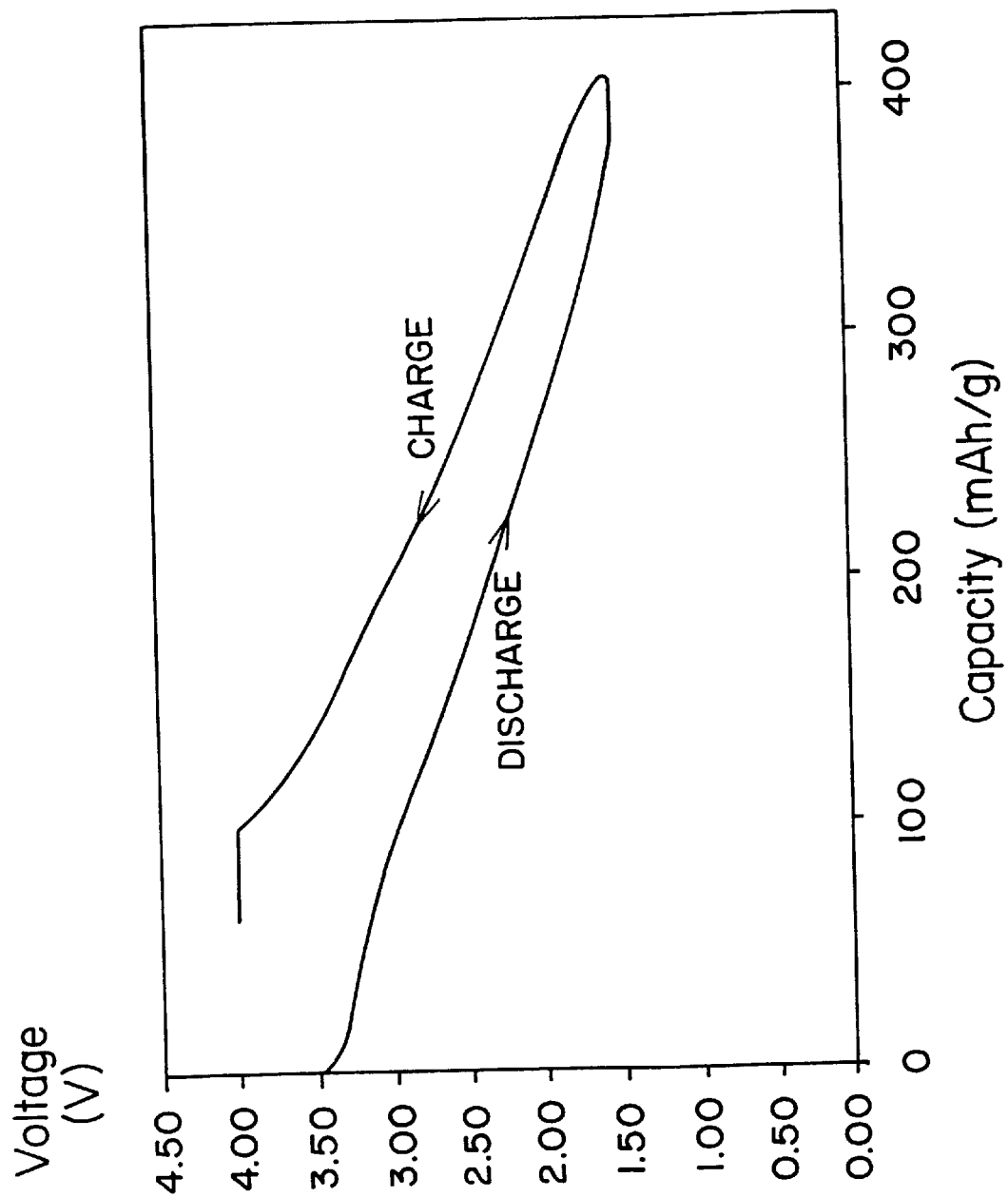
FIG. 4 is a graph illustrating the cathode voltage as a function of charge and discharge capacity of the vanadium oxide thin-film of FIG. 3.

In another set of experiments utilizing the method of the present invention, the flow rates of the precursor gas 34 containing vanadium oxytrichloride and the hydrogen 48 were fixed at 500 and 28 sccm, respectively, while the oxygen 42 flow rate was varied from 3.8 to 20 sccm. FIG. 3 illustrates the lithium charge capacity of the film 22 achieved from these variations as a function of oxygen flow rate, where all of the films were charged/discharged at a C/1 rate between 4.0 and 1.5 volts. The temperature during these tests was maintained at approximately 303 K. FIG. 3 clearly indicates that the charge capacity increased with increasing oxygen flow rate up to approximately 10.5 sccm, where the other deposition conditions were the same. The discharge capacity of the thin-film 22 produced in this particular example exceeded 408 mAh/g, or 1,265 mAh/cm³, under the discharge conditions illustrated in FIG. 4. In FIG. 4, the cathode voltage is plotted as a function of discharge/charge capacity. The energy density for this particular film, which is approximately 5,000 Å thick, was about 2977 Wh/L. This value is very close to the best value reported for cathode materials in the prior art.

EXAMPLE III

Figure 5:
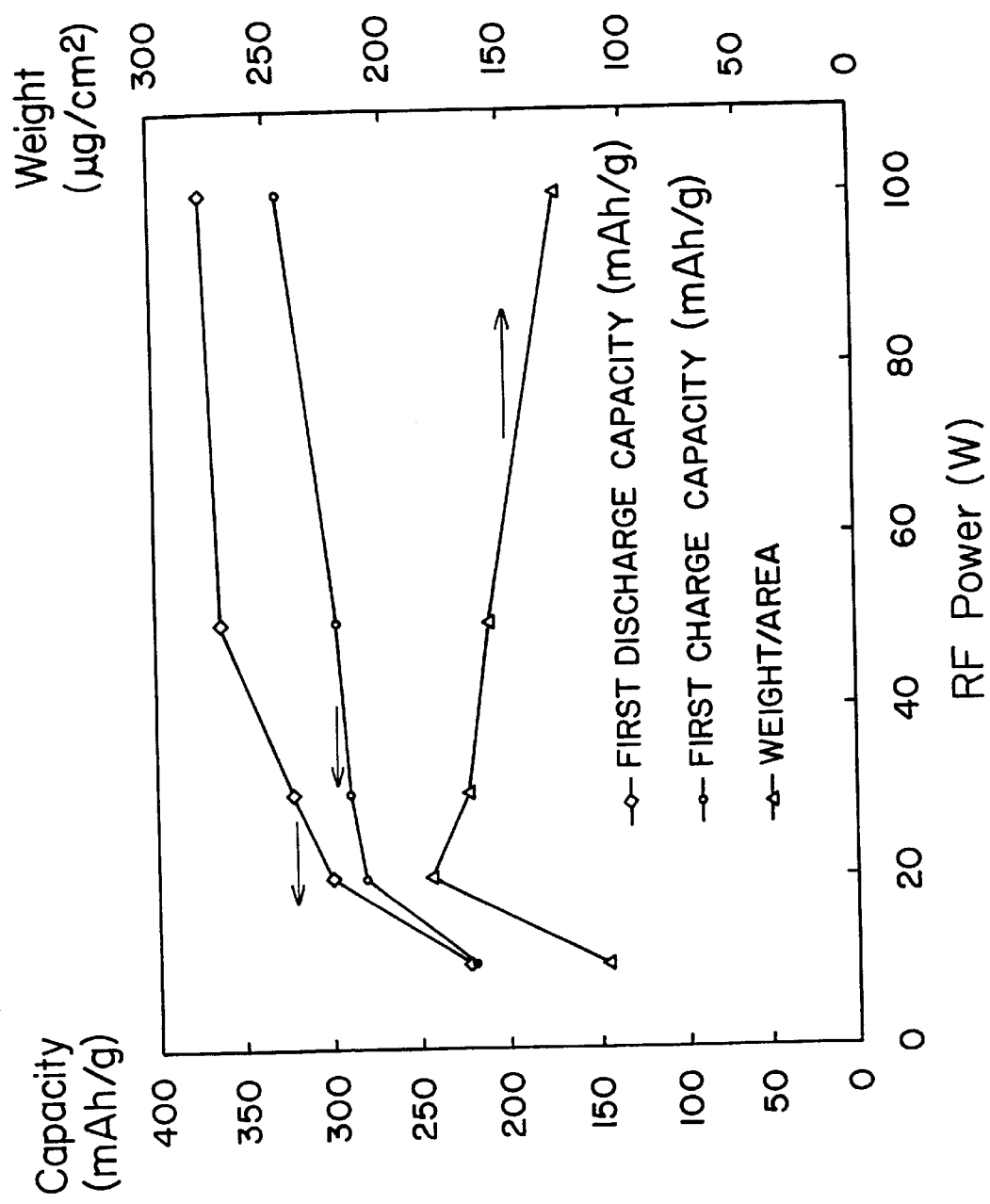
FIG. 5 is a graph illustrating charge and discharge capacity and unit weight of the subject vanadium oxide thin-film as a function of rf power applied in the method of the present invention.

In this set of experiments, the flow rate of the precursor gas 34 containing vanadium oxytrichloride, the hydrogen 48 and the oxygen 42 were fixed at 500, 28 and 7.5 sccm, respectively, while the rf power applied between the two electrodes 24 and 18 in the chamber was varied between 10 and 100 Watts. FIG. 5 illustrates the results of this particular experiment by illustrating the lithium charge capacity and the deposition rate, which is represented by the weight per unit area of sample deposited in 10 minutes, both as functions of the rf power. As can be seen from FIG. 5, while the maximum deposition rate was achieved at an rf power of approximately 20 Watts, the charge capacity of the film 22 in this particular example increased up to a power of approximately 50 Watts. Thus, a preferred rf power would appear to be approximately 50 Watts to provide maximum charge capacity, even though it might affect the deposition rate somewhat. Although the specific value of the optimized power depends on the geometry of the chamber, the general trend shown in FIG. 5 should be the same for other similar arrangements. In this preferred embodiment, the optimized power is 30–60 Watts for a chamber having a plasma volume of 1,400–1,500 cc, and as the chamber size and plasma volume increase, the optimized power required is proportionally increased as well.

EXAMPLE IV

Figure 6:
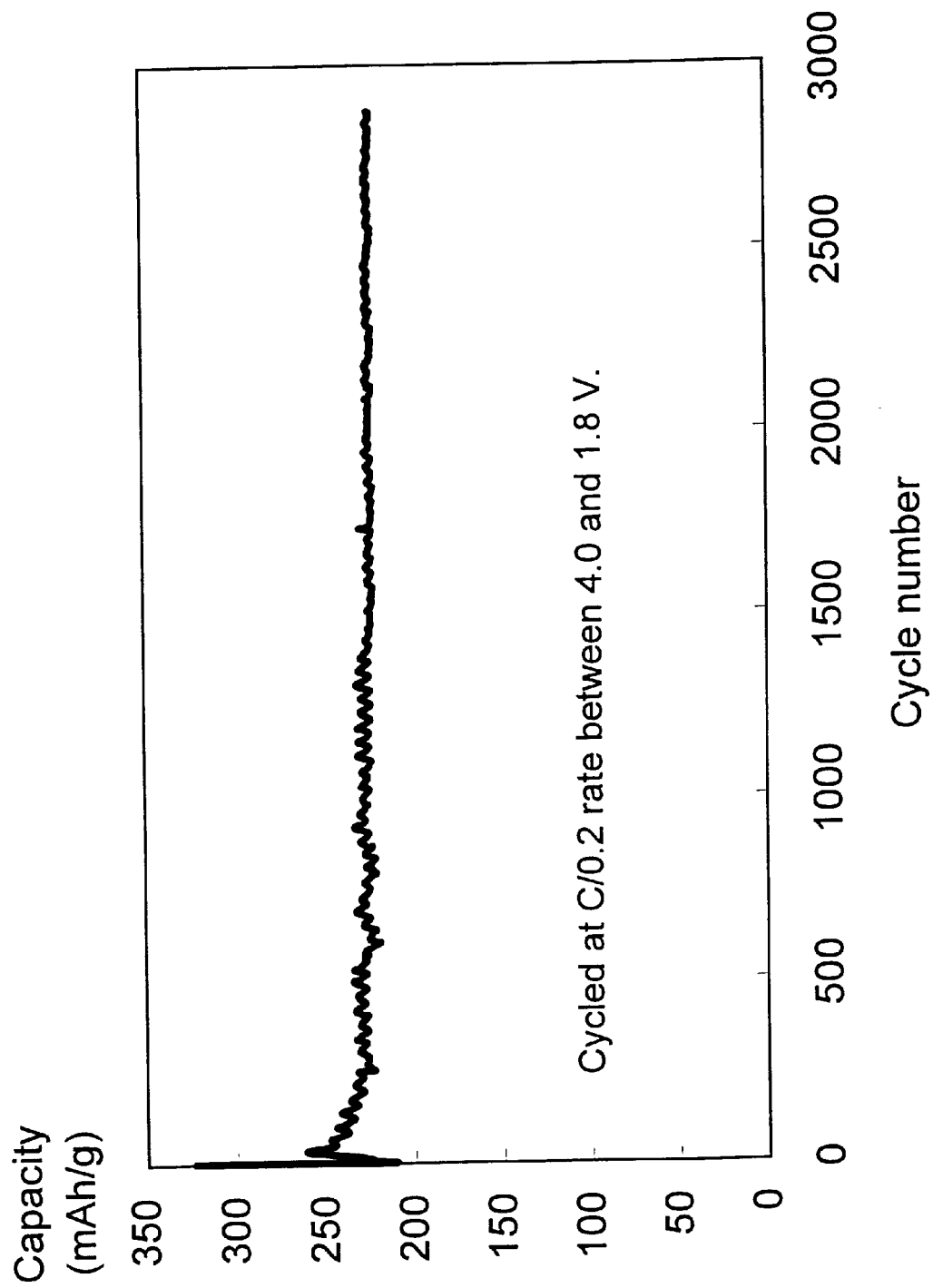
FIG. 6 is a graph illustrating the stability of a vanadium oxide film prepared using the method of the present invention by showing capacity of a cathode using the subject vanadium oxide thin-film as a function of the number of charge/discharge cycles when tested between 4.0 and 1.8 volts.
Figure 7:
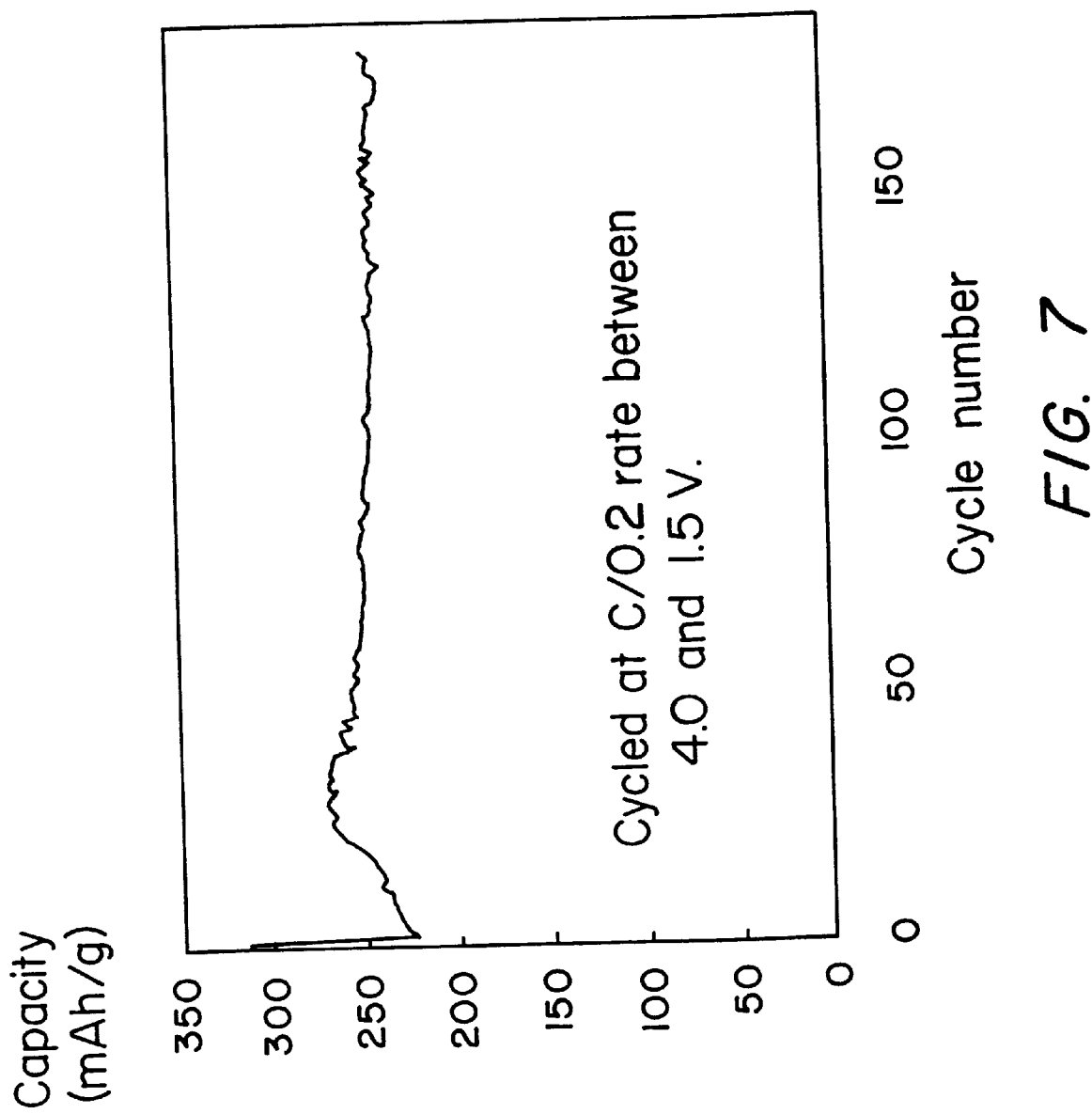
FIG. 7 is a graph similar to that of FIG. 6 but illustrating stability when the cathode is cycled between 4.0 and 1.5 volts.

Cycling tests of vanadium oxide thin-film cathodes described above were performed in two different voltage ranges utilizing vanadium oxide films 22 produced in accordance with the preferred method of the present invention. FIG. 6 illustrates the stability of the vanadium oxide film 22 when cycled between voltage limits of 4.0 and 1.8 volts. The indicated initial degradation of about 20% is common to most electrode materials and can be attributed to side reactions between the electrode and the electrolyte. The increase in the charge capacity after the second cycle can be attributed to the increased penetration length of the lithium ions with increasing soaking time of the electrode. As can be seen from FIG. 6, the films 22 exhibit negligible capacity fade from the second cycle all the way through 2900 cycles producing excellent stability. Referring to FIG. 7, the same testing was done except that the films 22 were cycled between limits of 4.0 and 1.5 volts. As can be seen from FIG. 7, the film 22 capacity is also very stable even when cycling over the wider voltage range.

EXAMPLE V

Figure 8:
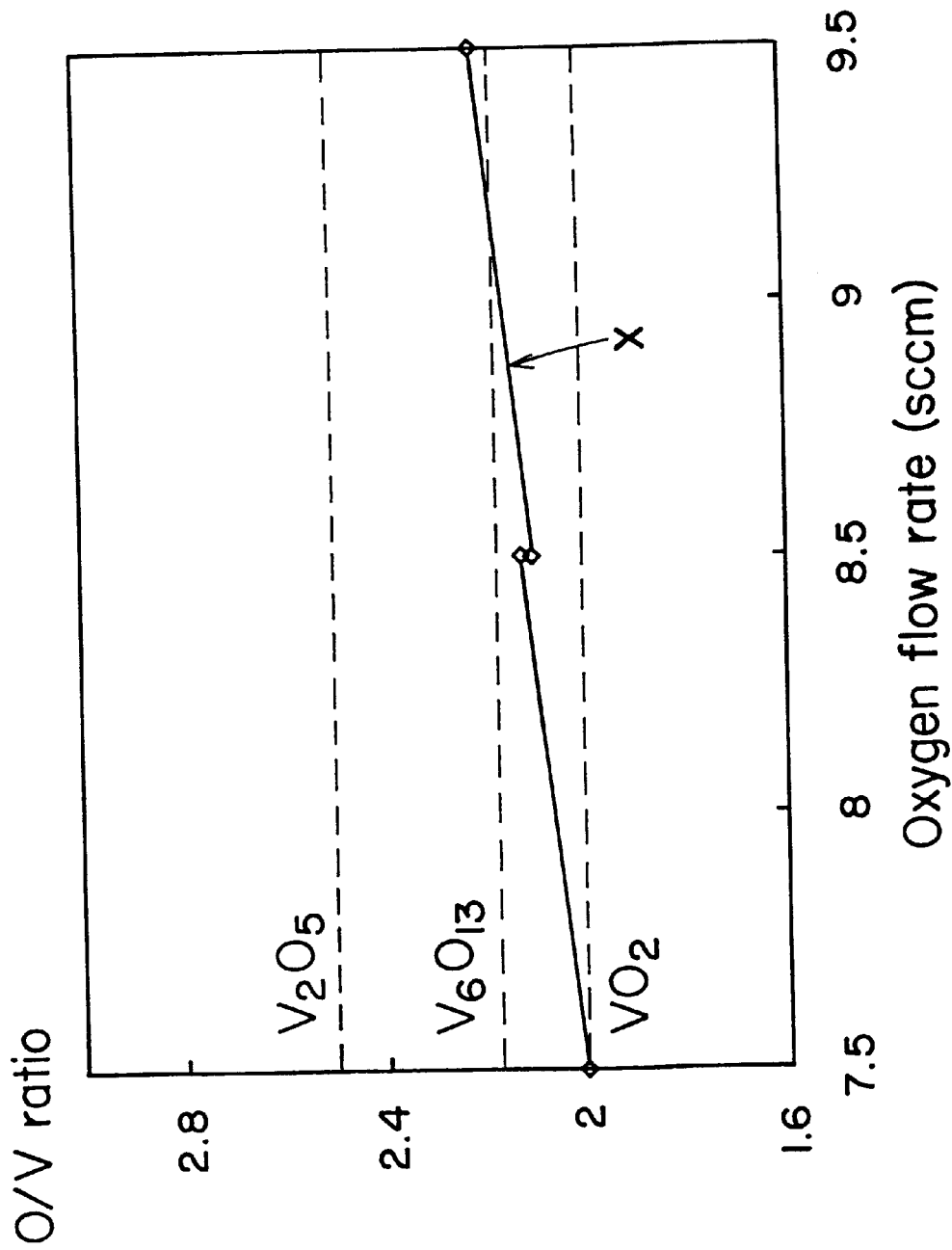
FIG. 8 is a graph illustrating the atomic ratio of oxygen to vanadium in the thin-films formed using the method of the present invention as a function of oxygen flow rate in the method of the present invention.

The film stoichiometry of the films 22 formed utilizing the present invention was measured by X-ray photoelectron spectroscopy. The atomic ratios of oxygen to vanadium of the films 22 are illustrated in FIG. 8, where the oxygen/vanadium ratio (O/V) is illustrated as a function of oxygen flow rate introduced during PECVD deposition of the present invention. The O/V ratio was measured after sputtering off a 20 Å surface layer to remove adsorbed contamination. The atomic ratio of oxygen to vanadium for $V_2O_5$, $V_6O_{13}$ and $VO_2$ are also plotted in FIG. 8 as references. As FIG. 8 clearly indicates, the best films, indicated by the line X, obtained in this work have an O/V ratio close to that of $V_6O_{13}$.

As can be seen from the above, PECVD thin-films of vanadium oxide is a very promising electrode material for secondary lithium batteries. For such applications, the capacity and cycle life of vanadium oxide thin-films is very important. Moreover, the rechargeability of the cathodes needs to be good because thin-film batteries are expected to be cycled more times with smaller charge/discharge currents. Moreover, in the case of thin-film cathodes, preparation methods must provide a better film morphology which enhances charge capacity and reversibility. Thus, an efficient deposition technique is critical to development of thin-film vanadium oxide cathodes for their application in thin-film rechargeable lithium batteries. The technique of the present invention generates a better film morphology/structure, has a larger lithium ion-charging capacity and has better cycling stability than previously available. It also significantly lowers the preparation temperature of the thin-film and improves the overall lifetime of the batteries.

The method of the present invention provides the ability to control the reacting species of vanadium-containing chloride gas, oxygen and hydrogen in a plasma enhanced CVD process which lowers the temperature of the substrate 20 receiving the film 22, thereby providing a maximum deposition rate and optimized film compositions. The vanadium oxide films formed from the method of the present invention have enhanced lithium discharge/charge capacities which are particularly useful in lithium rechargeable batteries, but are also applicable to electrochromic and thermochromic applications. The films have a high density and a high discharge capacity, and this combination makes these vanadium oxide films one of the best cathode materials as compared to other thin-film materials previously reported. Therefore, they are ideal for applications in high capacity/small volume rechargeable batteries. Moreover, the method of the present invention is also an ideal method due to its low cost and large area deposition capability with a thin-film deposition rate of more than five times higher than those films prepared by thermal evaporation. As previously indicated, the films of the present invention exhibit high discharge capacity and are very stable even after several thousands of cycles. This combination of high capacity, high cyclic stability and high deposition rate make this vanadium oxide material and deposition method an attractive choice for the battery industry.

The foregoing description and the illustrative embodiments of the present invention have been presented in detail in varying modifications and alternate embodiments. It should be understood, however, that the foregoing description of the present invention is exemplary only, and that the scope of the present invention is to be limited to the claims as interpreted in view of the prior art. Moreover, the invention illustratively disclosed herein suitably may be practiced in the absence of any element which is not specifically disclosed herein.

We claim:

1. A method of forming a vanadium oxide thin-film on a substrate for use as a cathode in a lithium-ion battery utilizing plasma enhanced chemical vapor deposition, said method comprising:

positioning a substrate within a plasma reaction chamber;

forming a precursor gas comprised of a reactive vanadium-containing precursor in an inert carrier gas and maintaining said precursor gas in a temperature range of about −23° C. to 127° C. and in a pressure range of about 1 torr to 760 torr;

forming a feed gas mixture by combining said precursor gas with hydrogen gas and oxygen gas, and flowing said feed gas mixture into said reaction chamber, wherein said precursor gas, said hydrogen gas and said oxygen gas have predetermined flow rates;

generating an rf plasma within said reaction chamber to effect a chemical reaction of said precursor gas with said hydrogen gas and said oxygen gas to cause room temperature deposition of said vanadium oxide thin-film on said substrate and formation of a byproduct gas, wherein said predetermined flow rate of said hydrogen gas is at a rate to provide sufficient hydrogen gas for reacting with said vanadium-containing precursor to form said byproduct gas and said vanadium oxide thin-film, but without reducing said vanadium oxide thin-film; and continuously removing the byproduct gas of said chemical reaction from said plasma reaction chamber.

2. The method of claim 1, wherein said vanadium-containing precursor is selected from the group consisting of $VX_3$, $VX_4$, $VOX_3$, vanadium hexacarbonyl, vanadium 2,4-pentanedionates, vanadium acetylacetonates, cyclopentadienyl vanadium tetracarbonyl, vandocene, and vanadyl alkoxides, where X=Cl, F, Br or I.

3. The method of claim 2, wherein said precursor gas comprises $VOCl_3$ in an inert carrier gas.

4. The method of claim 3, wherein said inert carrier gas comprises Argon gas.

5. The method of claim 4, wherein the precursor gas has a precursor gas vapor pressure and said $VOCl_3$ has a partial pressure of approximately 1% of the precursor gas vapor pressure.

6. The method of claim 3, including forming said feed gas mixture with a gas flow ratio of $VOCl_3$:Y:Z, where $VOCl_3$ is 1, Y is $H_2$ and ranges approximately from 1 to 50, and Z is $O_2$ and ranges approximately from 0.5 to 50.

7. The method of claim 6, wherein Y is approximately 1.5 and Z ranges approximately from 0.50 to 0.75.

8. The method of claim 1, including maintaining said vanadium-containing precursor at a temperature of about 10° C. and at a pressure of about 8 torr while adjusting the inert carrier gas to a pressure of about 800 torr so that partial pressure of the vanadium-containing precursor is about 1% of the precursor gas pressure.

9. The method of claim 1, including applying rf power of approximately 30–60 watts per 1,400–1,500 cc of plasma volume in the reaction chamber in order to generate the rf plasma to initiate and accelerate the film deposition.

10. The method of claim 1, including selecting said predetermined flow rates of said vanadium-containing precursor gas, said hydrogen gas, and said oxygen gas such that said vanadium oxide thin-film is deposited at a rate of about 11 Å/s, and wherein said vanadium oxide thin-film has a density in a range of about 150–200 $\mu g/cm^2$, a film charge capacity of about 300 mAh/g, a discharge capacity of about 360 mAh/g, a film energy density of about 2977 Wh/L, and a film cyclability of at least 2900 cycles.

11. The method of claim 1, including maintaining pressure in the plasma reaction chamber at less than approximately 1 torr during deposition of said film on said substrate.

12. A method of forming a vanadium oxide thin-film on a substrate, comprising:

initiating and sustaining a reaction of oxygen, hydrogen, and a vanadium-containing precursor selected from the group consisting of $VX_3$, $VX_4$, and $VOX_3$, where X is Cl, F, Br, or 1, in an rf plasma which disassociates the vanadium-containing precursor, wherein said hydrogen combines with and removes disassociated X ions from the plasma as a byproduct gas and accelerates the reaction of said disassociated vanadium precursor with said $O_2$ to cause a room-temperature deposition of said vanadium oxide thin-film on said substrate, and wherein said hydrogen is present in a sufficient amount to remove said disassociated X ions without reducing said vanadium oxide thin-film.

13. The method of claim 12, wherein the vanadium-containing precursor is $VOCl_3$, and including feeding the $VOCl_3$ into the reaction along with said $H_2$ and said $O_2$ in a $VOCl_3$:$H_2$:$O_2$ volume flow ratio of 1:Y:Z, where Y is $H_2$ and is in a range of about 1 to 50 and Z is $O_2$ and is in a range of about 0.5 to 50.

14. The method of claim 13, wherein Y is approximately 1.5 and Z is in a range of about 0.50 to 0.75.

15. The method of claim 12, including depositing from said reaction a vanadium oxide thin-film including one or more of the group consisting of $VO_2$, $V_2O_5$, and $V_6O_{13}$.

* * * * *

UNITED STATES PATENT AND TRADEMARK OFFICE
CERTIFICATE OF CORRECTION

PATENT NO.    : 6,156,395
DATED         : December 5, 2000
INVENTOR(S)   : Ji-Guang Zhang et al.

It is certified that error appears in the above-identified patent and that said Letters Patent is hereby corrected as shown below:

Column 10,
Line 18, replace "C1, F, Br, or 1, in an rf plasma which disassociates the" with
-- C1, F, Br, or l, in an rf plasma which disassociates the --

Signed and Sealed this

Twenty-eighth Day of October, 2003

JAMES E. ROGAN
*Director of the United States Patent and Trademark Office*